United States Patent [19]

Irikawa et al.

[11] Patent Number: 5,362,974
[45] Date of Patent: Nov. 8, 1994

[54] GROUP II-VI MATERIAL SEMICONDUCTOR OPTICAL DEVICE WITH STRAINED MULTIQUANTUM BARRIERS

[75] Inventors: Michinori Irikawa, Yokohama; Kenichi Iga, Tokyo, both of Japan

[73] Assignee: The Furukawa Electric Co., Ltd., Tokyo, Japan

[21] Appl. No.: 73,434

[22] Filed: Jun. 9, 1993

[30] Foreign Application Priority Data

Jun. 10, 1992 [JP] Japan .................. 4-177437

[51] Int. Cl.$^5$ .................. H01L 29/161; H01L 27/12
[52] U.S. Cl. .................. 257/15; 257/17; 257/18; 372/45; 372/46
[58] Field of Search .................. 257/14, 15, 17, 18, 257/97, 96; 372/45, 46, 43

[56] References Cited

U.S. PATENT DOCUMENTS

| | | | |
|---|---|---|---|
| 5,034,958 | 7/1991 | Kwon et al. | 257/14 |
| 5,208,820 | 5/1993 | Kurihara et al. | 372/45 |
| 5,226,053 | 7/1993 | Cho et al. | 372/45 |
| 5,237,581 | 8/1993 | Asada et al. | 372/45 |

FOREIGN PATENT DOCUMENTS

5-7051  1/1993  Japan .................. 372/46

OTHER PUBLICATIONS

Appl. Phys. Lett. 59 (27), Dec. 30, 1991, pp. 3619–3621, Jeon et al., "Blue-green injection laser diodes in (Zn,Cd) Se/ZnSe QW".
Electronics Letters, vol. 22, No. 19, Sep. 11, 1986, pp. 1008–1009, Iga et al., "Electron reflectance of multiquantum barrier (MQB)".
Iga, et al., Conference on Laser and Electro-Optics, Calif., Tech. Digest 12,5 (1992), "Visible Laser Diodes", paper No. 4.
Appl. Phys. Lett. 55 (19), Oct. 30, 1989, pp. 1877–1878, Fritz et al., "Band-edge alignment in heterostructures".
Xie et al., "Blue and Blue/Green Injection Laser Diodes and Light Emitting Diodes", Japan Institute of Appl. Phys., Spring Conference 1992.

Primary Examiner—Rolf Hille
Assistant Examiner—Minhloan Tran
Attorney, Agent, or Firm—Jacobson, Price, Holman & Stern

[57] ABSTRACT

This invention provides a blue light semiconductor optical device capable of effectively oscillating in a temperature range above room temperature. A double hetero structure semiconductor optical device according to the invention is made of a compound semiconductor containing Zn and/or Cd as group II elements and S and/or Se and/or Te as group VI elements and comprises an active layer, a light confining layer and a cladding layer arranged on a semiconductor substrate as well as a multiquantum barrier structure having a strained superlattice layer in part of the cladding layer or the light confining layer for an effect of reflecting incident carriers as waves in phase conditions capable of allowing mutual enhancement of the incident and reflected waves.

9 Claims, 4 Drawing Sheets

GROUP II-VI MATERIAL SEMICONDUCTOR OPTICAL DEVICE WITH STRAINED MULTIQUANTUM BARRIERS

BACKGROUND OF THE INVENTION

1. Field of the Invention

This invention relates to a semiconductor device and, more particularly, to a semiconductor laser device capable of emitting blue light.

2. Prior Art

II-VI group compounds are attracting attention as such compounds seem particularly promising for the generation of blue laser.

Papers Nos. 1 and 2 listed below describe some such materials capable of emitting blue light.

Paper No. 1: H. Jeon et al., Appl. Phys. Lett., 59 (1991), 3619.

Paper No. 2: W. Xie et al., Col. of Papers for 1992 spr. 28a, Japan Institute of Applied Physics Each of the semiconductor laser devices described in these papers comprises, as typically illustrated in FIG. 4 of the accompanying drawings, an n+—GaAs buffer layer 1a, an n-ZnS$_{0.054}$Se$_{0.945}$ cladding layer 2, a 0.5 μm thick n-ZnSe (Cl doping rate: $5 \times 10^{17}$ cm$^{-3}$) optical confinement layer 3, an active layer 4 having a multiquantum well structure constituted by a Cd$_{0.2}$Zn$_{0.8}$Se well layer 4b and a ZnSe barrier layer 4a, a 0.5 μm thick p-ZnSe (N doping rate: $4 \times 10^{17}$ cm$^{-3}$) optical confinement layer 5, a 1 μm thick p-ZnS$_{0.054}$Se$_{0.945}$ cladding layer 6 and a 1,000 Å thick p+—ZnSe cap layer 7, sequentially laid on a n+—GaAs substrate 1 to form a multilayer structure.

Semiconductor laser devices involving a II-VI group compound are, however, not without problems. One of the problems is the difficulty of p- and n-type doping and the other is that they often tend to show poor performances mainly because they have a rather low heterobarrier.

Fortunately, the first problem has been substantially resolved as p-type doping operations can be carried out to a degree of $10^{18}$ cm$^{-3}$, if plasma is used for nitrogen doping.

The second problem, on the other hand, is intrinsically a difficult problem, because there is no combination of materials having a large heterobarrier (a large difference in the bandgap) and emitting blue light and at the same time having a lattice-matching feature.

In other words, if a semiconductor laser device is prepared, using such a compound, either of the active layer or the carrier confining cladding layer of the device needs to be a strained superlattice layer.

The amount of strain allowed to a strained layer, however, is limited because of the restriction posed on such a layer by the relationship between the critical layer thickness and the amount of strain. Hence, inevitably the difference in the band gap between the active layer and the cladding layer of a semiconductor laser device of the type under consideration cannot be made satisfactorily large.

The height of the heterobarrier in a double heterojunction structure at the time of laser oscillation will be briefly described below.

The heterobarrier $\Delta E_c$ at the conduction band side of the active and p cladding layers is generally expressed by formula (1) below, if the active layer is p-doped.

$$\Delta E_c = \Delta E_g - |(E_{Afp} - E_{Av}) - (E_{CLfp} - E_{CLV})| \quad (1)$$

where $\Delta E_g$: difference in the band gap, $E_{Afp}$: quasi-Fermi level for the hole in the active layer under lasing condition, $E_{Av}$: energy level for the valence electron band edge of the active layer under lasing condition, $E_{CLfp}$: quasi-Fermi level for the hole in the p cladding layer under lasing condition, and $E_{CLV}$: energy level for the valence band edge of the p cladding layer under lasing condition.

The value within | | normally becomes small when the p cladding layer is sufficiently doped. Then, a small value for $\Delta E_g$ simply signifies a small heterobarrier in conduction band.

Incidentally, the value of the second term within | | increases to further reduce the value of $\Delta E_c$, if the p cladding layer is insufficiently doped.

By referring to the Paper No. 1 listed above, the value for $\Delta E_g$ between ZeSe and Cd$_{0.2}$Zn$_{0.8}$Se is reported to be 0.26 eV for a conventional semiconductor laser device as illustrated in FIG. 4 of the accompanying drawings.

This value is about 40% smaller than $\Delta E_g = 0.4$ eV of a GaInAsP/InP system for 1.3 μm lasers. If the carrier concentration injected into the active layer is assumed to be 3 to $6 \times 10^{18}$ cm$^{-3}$, the second term of formula (1) will be 50 to 80 meV.

On the other hand, the lowest quantum energy level of a quantum well is as high as about 50 meV from the conduction band edge and the quasi-Fermi level for electrons in the active layer becomes higher than this quantum energy level by 40 to 70 meV. Hence, the heterobarrier height will be about 60 to 120 meV as measured from the quasi-Fermi level of the active layer.

Thus, since $\Delta E_c$ of a conventional semiconductor laser device having a configuration as illustrated in FIG. 4 does not have a sufficiently large $\Delta E_c$ and, because of this, carriers or electrons in particular easily overflow to the p cladding layer side to generate leakage currents, which by turn prevents CW oscillation at a high temperature range above room temperature, deteriorating the performance of the semiconductor device for emitting blue light.

In view of the above identified technological problems, it is therefore an object of the present invention to provide a semiconductor laser device capable of emitting blue light and having a sufficiently large $\Delta E_c$ for CW oscillation in a high temperature range above room temperature and other desired performances.

SUMMARY OF THE INVENTION

According to the invention, the above object and other objects of the invention are achieved by providing a double heterostructure semiconductor optical device made of a compound semiconductor containing Zn and/or Cd as II-group elements and S and/or Se and/or Te as VI group elements and comprising (an) active layer(s), optical confinement layered and a pair of cladding layers arranged on a semiconductor substrate including in part of the cladding layer or the optical confinement layers, a multiquantum barrier structure consisting of strained superlattice layer and which reflects incident carriers as waves with phases capable of allowing mutual enhancement of the incident and reflected waves.

Said multiquantum barrier structure preferably contains Zn$_x$Cd$_{1-x}$S$_y$Se$_{1-y}$ ($0 \leq x \leq 1$, $0 \leq y \leq 1$).

Alternatively, said multiquantum barrier structure contains $Zn_xCd_{1-x}Te$ ($0 \leq x \leq 1$).

The concept of a multiquantum barrier (MQB) structure was proposed by K. Iga et al.

As described in papers Nos. 3 and 4 listed below, the principle of the MQB is to realize a barrier height greater than a classical barrier height by the "resonance scattering" of the incident carriers i.e., to reflect carriers incident upon a superlattice structure as waves in phase conditions capable of allowing mutual enhancement of the incident and reflected waves.

On the other hand, the theory of increasing the height of a heterobarrier by utilizing a strained superlattice structure of a III-V compound semiconductor is described in Paper No. 5 listed below.

Japanese Patent Publication No. Hei 5-7051 and Paper 6 disclose a method to utilize above strain effect for forming a multiquantum barrier structure to realize an enhanced effective barrier height in a GaInAsP system light emitting device.

Paper No. 3: K. Iga et al., Electron Lett., 22, 1008 (1986)

Paper No. 4: K. Iga et al., Conference on Laser and Electro-Optics, California, Tech. Digest 12 (1992) 2.

Paper No. 5: F. L. Schuermeyer et al., Appl. Phys. Lett., 55, 1877 (1989)

Paper No. 6: M. Irikawa et al., Jpn. J. Appl. Phys. 31 (1992) L1351

The present invention was made by applying the concept to a blue light emitting semiconductor laser device using a II-VI group compound. Such a device is typically characterized by the following.

(1) Since a strained superlattice layer having above described features is used for a multiquantum barrier structure, the heterobarrier height can be artificially controlled and determined so that an ever large effective barrier height can be realized by combining materials having a high heterobarrier. (See Papers Nos. 5 and 6.)

(2) If a bulk cladding layer is used in a II-VI group compound semiconductor laser device, the only possible way to increase the value of $\Delta E_c$ is to increase the extent of deformation of the active layer. However, the use of such a technique cannot exceed the technological status quo.

If a strained superlattice structure is used for part of the cladding layer of a semiconductor laser device of the type under consideration as in the case of the present invention, a material having a greater heterobarrier height can be used for that part of the cladding layer. Then, by employing the principles of multiquantum barrier structure, a cladding layer with sufficiently high barrier height can be realized and no leakage current will take place due to tunneling.

Now, the present invention will be described in greater detail by referring to the accompanying drawings that illustrate a preferred embodiment of the invention.

DETAILED DESCRIPTION OF THE INVENTION

Figure 1:
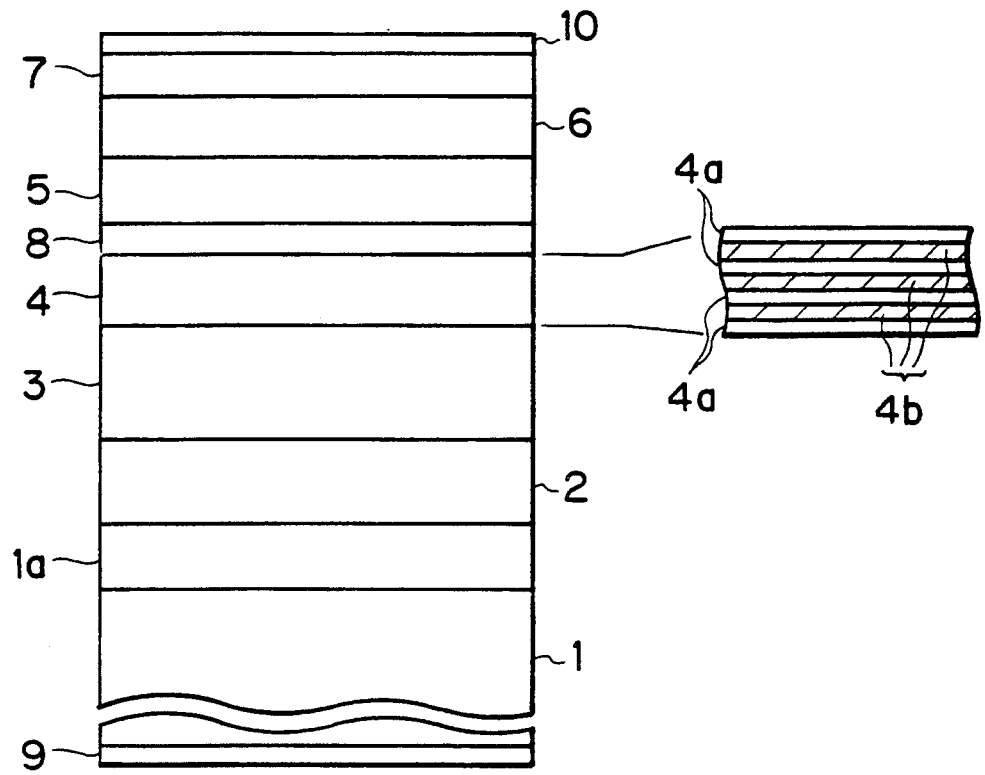
FIG. 1(a) is a schematic cross sectional view of a preferred embodiment of semiconductor laser device of the invention.
FIG. 1(b) is a schematic illustration of the conduction energy band of embodiment of FIG. 1(a) under lasing condition.
Figure 1:
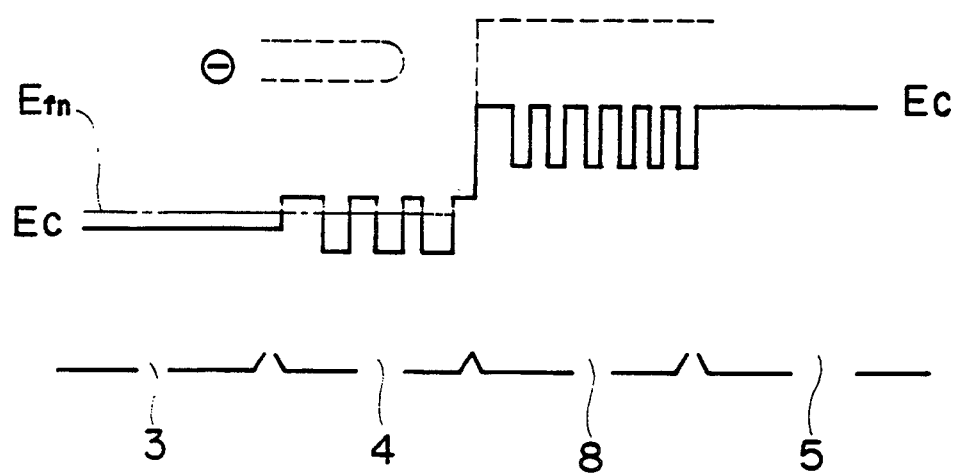

FIG. 1(a) is a schematic cross sectional view of a preferred embodiment of semiconductor laser device of the invention and FIG. 1(b) is a schematic illustration of the conduction energy band of embodiment of FIG. 1(a) under lasing condition.

The embodiment of semiconductor laser device of the invention comprises an $n^+$—GaAs buffer layer 1a, an n-ZnSSe cladding layer 2, an n-ZnSe optical confinement layer 3, an active layer 4 having a multiquantum well structure constituted by a CdZnSe well layer 4b and a ZnSe barrier layer 4a, a strained superlattice multiquantum barrier layer 8, a p-ZnSe optical confinement layer 5, a p-ZnSSe cladding layer 6 and a $p^+$ZnSe cap layer 7 sequentially grown on an $n^+$—GaAs substrate 1 to form a multilayer structure, to which an n-electrode 9 and a p-electrode 10 are deposited.

Figure 4:
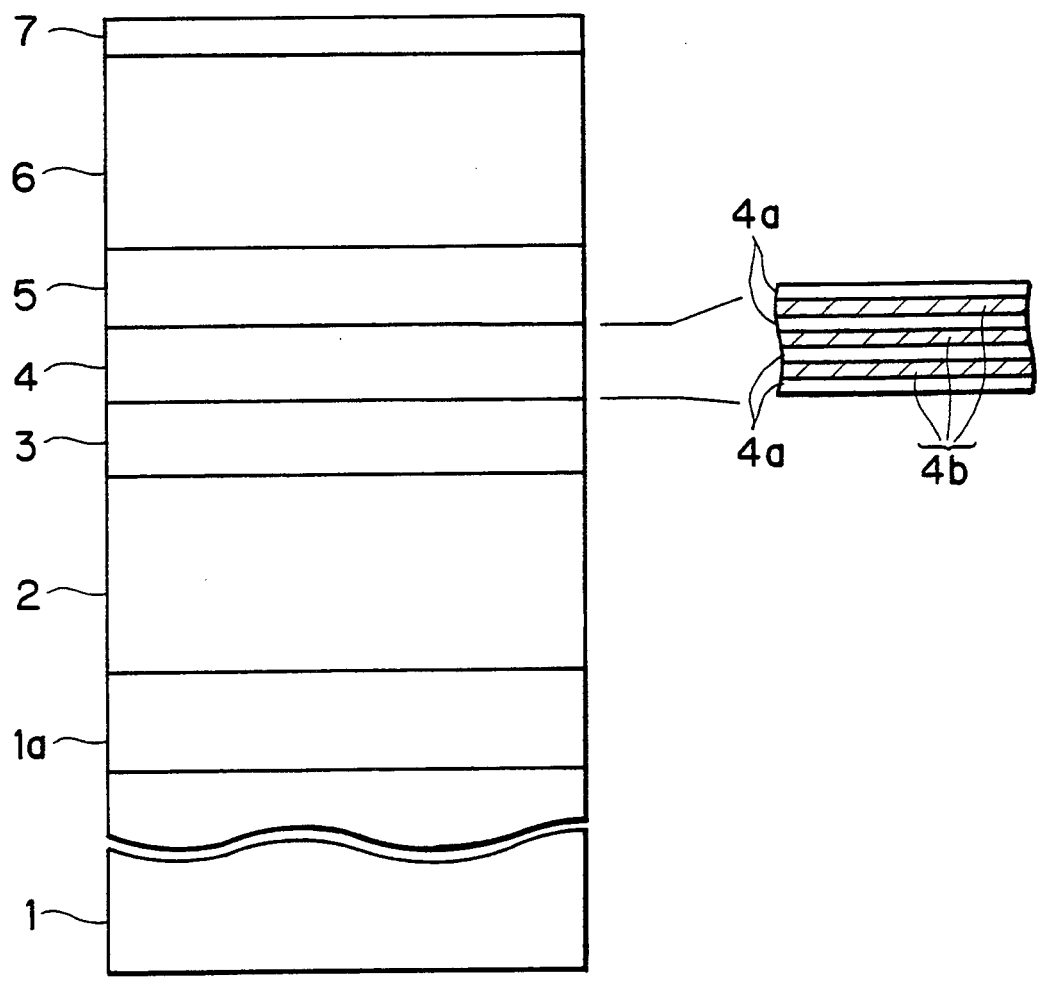
FIG. 4 is a schematic cross sectional view of a conventional II-VI semiconductor laser device.

Referring to the multilayer structure of FIG. 1(a), the semiconductor substrate 1 and the layers 1a through 7 except the strained layer barrier layer 8 of the embodiment are identical with their counterparts of a conventional device as described earlier by referring to FIG. 4.

Figure 2:
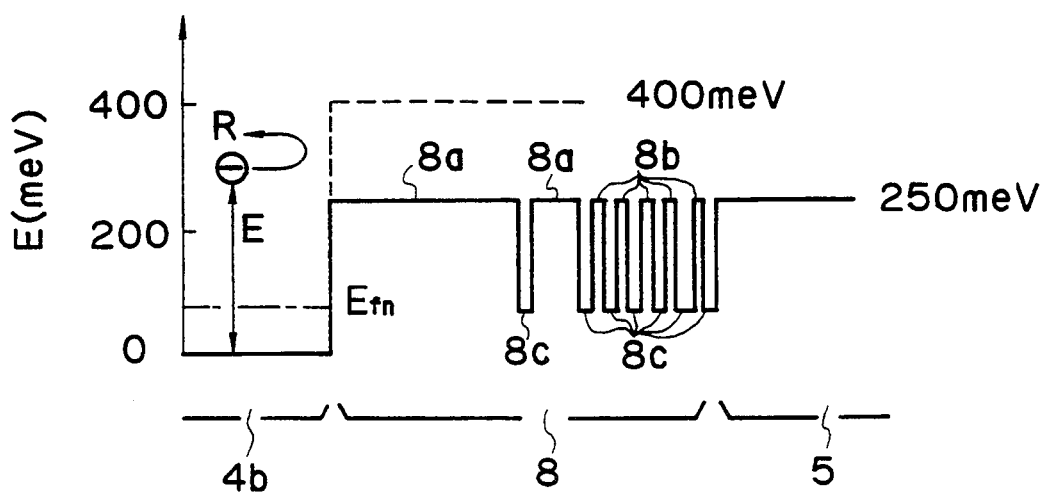
FIG. 2(a) is a schematic illustration of a one-dimensional potential model for the multiquantum barrier structure of the embodiment of FIG. 1(a).
FIG. 2(b) is a graph showing the relationship between the energy level of incident electrons and the reflection coefficient of the embodiment of FIG. 1(a) obtained by calculations.
Figure 2:
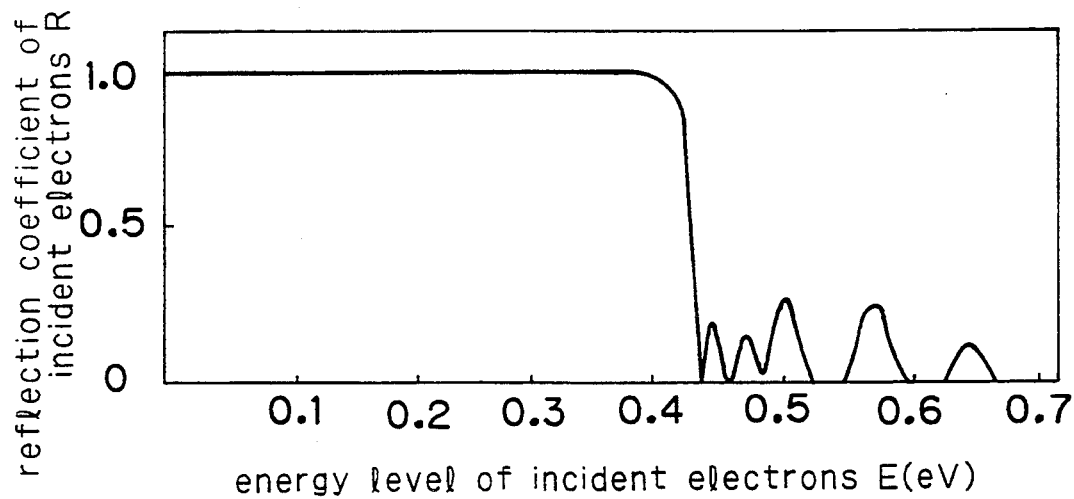

On the other hand, the strained layer multiquantum barrier 8 of FIGS. 1(a) and 1(b) by turn comprises a barrier layer 8a constituted by a (1) 80-ML (monolayer) thick ZnSe layer and a (1) 20-ML thick ZnSe layer which are laid in this order on the active layer 4 as shown in FIG. 2(a), another barrier layer 8b constituted by five (5) 6-ML thick $ZnS_{0.3}Se_{0.7}$ layers, each having a 1.4% tensile strain, and seven (7) 6-ML thick $Cd_{0.2}Zn_{0.8}Se$ layers, each having a 1.4% compressive strain.

In other words, a number of tensile strained layers and compressive strained layers are alternately grown in the embodiment to produce a thick strained superlattice for the multiquantum barrier layer 8.

FIG. 2(a) is a schematic illustration of a one-dimensional potential model for the multiquantum barrier structure of the embodiment of FIG. 1(a) and FIG. 2(b) is a graph showing the relationship between the energy level of electrons coming into the strained layer multiquantum barrier 8 from the active layer 4 and the reflection coefficient of the embodiment of FIG. 1(a) obtained by calculations, using a Schroedinger equation and the transfer matrix method (see Papers No. 3 and 6) along with the potential model of FIG. 2(a).

In the calculations, the effective masses of $Cd_{0.2}Zn_{0.8}Se$, ZnSe and $ZnS_{0.3}Se_{0.7}$ are respectively assumed to be $0.15m_0$, $0.16m_0$ and $0.23m_0$, where $m_0$ is the rest mass of electron.

As will be appreciated from FIG. 2(b), an effective barrier height of 0.4 eV is obtained for the semiconductor laser device of FIGS. 1(a) and 1(b).

When the quasi-Fermi level of the $Cd_{0.2}Zn_{0.8}Se$ well layer 4b of the active layer 4 is assumed to be 70 meV for the electrons in the model of FIG. 2(a), the barrier height from the quasi-Fermi level will be 180 meV for a conventional ZnSe layer and 330 meV for the strained layer multiquantum barrier layer 8.

The increase of 150 meV in the barrier height over a conventional ZnSe layer as measured from the quasi-Fermi level of the active layer 4 makes the effective height to be about 210 to 270 meV, which is substantially equal to the barrier height of any GaInAsP/InP system semiconductor laser devices currently used for telecommunications.

Thus, the embodiment of semiconductor laser device of the invention has a heterobarrier height almost twice as high as that of a conventional device.

Figure 3:
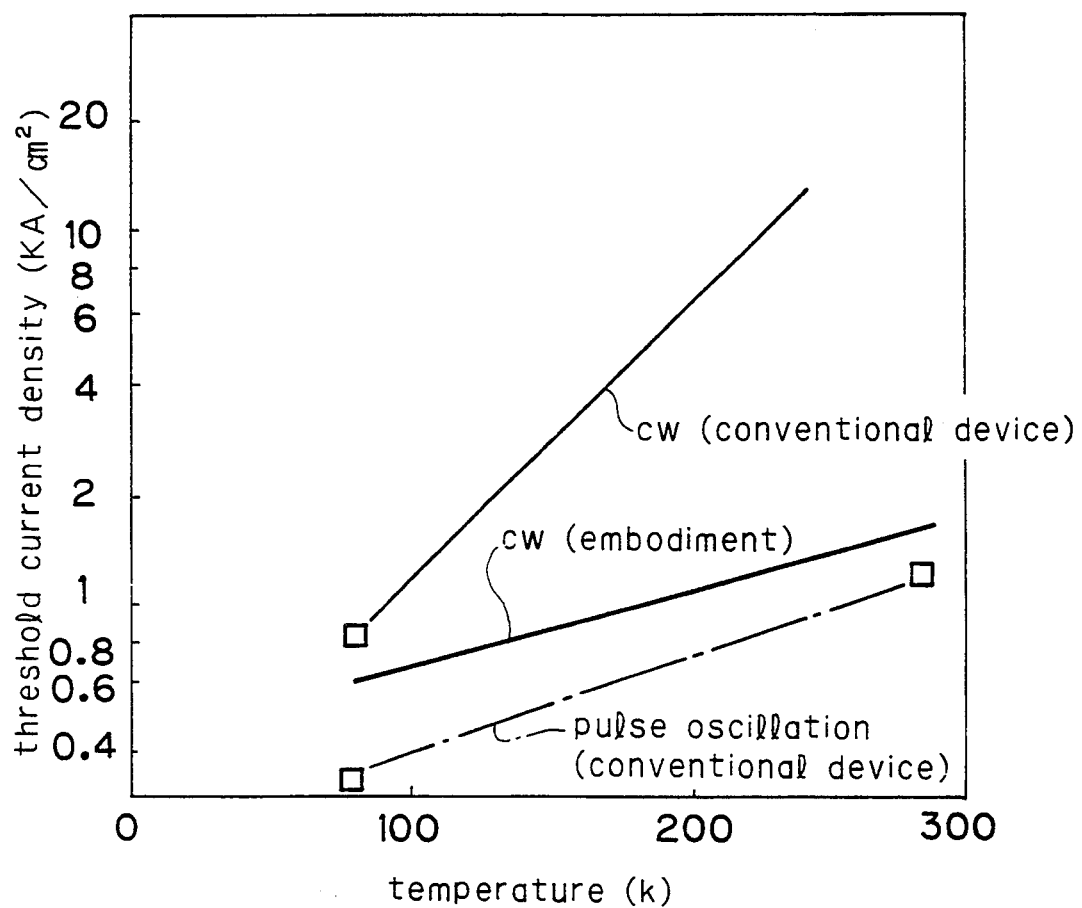
FIG. 3 is a graph showing the relationship between the threshold current density and the temperature of the embodiment of FIG. 1(a).

FIG. 3 schematically illustrates the difference in the temperature dependency of the threshold current density of the embodiment and a conventional device.

Referring to FIG. 3, squares indicate measured values reported for conventional devices whereas CW (conventional device) indicates a straight line obtained by plotting values assumed from existing data on optical excitation for conventional devices.

On the contrary, CW (embodiment) (broken line) shows an expected temperature dependency of a blue light semiconductor laser device according to the invention. It is expected to be feasible for oscillation with a low threshold value in practical applications involving a high temperature range above room temperature.

It should be noted that the present invention is not limited to the above described embodiment and a (Zn, Cd) S system compound may be used on a GaP or GaAs substrate for a (Zn, Cd) (S, Te) system compound can be used on a GaAs or InGaAs substrate to realize a multiquantum barrier structure.

Layers of a semiconductor optical device according to the invention can appropriately be made to grow on a substrate by means of an MOCVD or gas source MBE method.

As is obvious from the above description, since a double heterostructure semiconductor optical device according to the invention is made of a compound semiconductor containing Zn and/or Cd as group II elements and S and/or Se and/or Te as group VI elements and has a strained superlattice layer in part of the cladding layer or the optical confinement layer for an effect of reflecting incident carriers as waves in phase conditions capable of allowing mutual enhancement of the incident and reflected waves, it can perform CW oscillation effectively in a temperature range above room temperature.

What is claimed is:

1. A semiconductor optical device comprising:
   a semiconductor substrate;
   a first cladding layer formed on said semiconductor substrate;
   a first optical confinement layer formed on said first cladding layer;
   an active layer formed on said first optical confinement layer;
   a multiquantum barrier layer formed on said active layer;
   a second optical confinement layer formed on said multiquantum barrier layer; and
   a second cladding layer formed on said second optical confinement layer;
   wherein said multiquantum barrier layer comprises a strained layer superlattice of group II-VI material, and said cladding layers comprise $ZnS_xSe_{1-x}$ ($0<x<1$) or $Zn_xCd_{1-x}S$ ($0<x<1$).

2. The device of claim 1, wherein said multiquantum barrier layer comprises alternately formed layers of tensile strained layers and compressive strain layers.

3. The device of claim 1, wherein said multiquantum barrier layer comprises layers of $Zn_xCd_{1-x}S_ySe_{1-y}$ ($0<x, y<1$) and layers of $ZnS_xSe_{1-x}$, ($0<x<1$).

4. The device of claim 1, wherein said multiquantum barrier layer comprises layers of $Zn_xCd_{1-x}Te$ ($0<x<1$) and layers of $ZnS_xSe_{1-x}$, ($0<x<1$).

5. The device of claim 1, wherein the substrate layer comprises GaAs.

6. The device of claim 1, wherein the substrate layer comprises GaP.

7. The device claim 1, wherein the substrate layer comprises InGaAs.

8. The device of claim 1, wherein the multiquantum barrier layer comprises:
   a first barrier layer formed on said active layer comprising two layers of ZnSe; and
   a second barrier layer formed on said first active layer comprising alternately disposed tensile strain layers and compressive strain layers.

9. The device of claim 8, wherein the tensile strain layers of the second barrier layer comprise $ZnS_xSe_{1-x}$, ($0<x<1$). the compressive strain layers comprise $Zn_xCd_{1-x}Se$ ($0<x<1$).

* * * * *